United States Patent
Hieda et al.

(10) Patent No.: US 6,887,592 B2
(45) Date of Patent: May 3, 2005

(54) ORGANIC EL ELEMENT

(75) Inventors: Shigeru Hieda, Mobara (JP); Yoshihisa Tsuruoka, Mobara (JP); Hisamitsu Takahashi, Mobara (JP); Satoshi Tanaka, Mobara (JP)

(73) Assignee: Futaba Corporation, Mobara (JP)

( * ) Notice: Subject to any disclaimer, the term of this patent is extended or adjusted under 35 U.S.C. 154(b) by 0 days.

(21) Appl. No.: 10/382,905

(22) Filed: Mar. 7, 2003

(65) Prior Publication Data

US 2003/0170496 A1 Sep. 11, 2003

(30) Foreign Application Priority Data

Mar. 7, 2002 (JP) ........................................ 2002-061652

(51) Int. Cl.$^7$ .............................................. H05B 33/04
(52) U.S. Cl. ....................... 428/690; 428/917; 313/504; 313/506; 313/512
(58) Field of Search .......................... 428/76, 690, 917; 313/504, 512; 257/100

(56) References Cited

U.S. PATENT DOCUMENTS 5,958,610 A * 9/1999 Yonekawa et al. .......... 428/690
6,641,933 B1 * 11/2003 Yamazaki et al. .......... 428/690
2002/0057565 A1 * 5/2002 Seo ............................. 362/84

FOREIGN PATENT DOCUMENTS

JP      2002033187 A   *   1/2002

* cited by examiner

Primary Examiner—Dawn Garrett
(74) Attorney, Agent, or Firm—Oblon, Spivak, McClelland, Maier & Neustadt, P.C.

(57) ABSTRACT

An organic EL device having a drying medium capable of suppressing the growth of a dark spot equipped with a water-capturing medium layer for chemically capturing water placed on a water-capturing medium holding layer. The organic EL device is comprised of a sealed container having a glass substrate and a sealing cap bonded to the glass substrate. The sealed container is provided with a light emitting region formed on the substrate which is formed of organic EL material layers placed between a pair of opposite anode and cathode electrodes. The sealed container further includes a water-capturing medium holding layer provided on an inner surface of the container spaced apart from the light emitting region and a water-capturing medium holding layer.

10 Claims, 3 Drawing Sheets

ORGANIC EL ELEMENT

BACKGROUND OF THE INVENTION

1. Field of the Invention

The present invention relates to an organic EL device, and more particularly, to an improvement of a water-capturing medium placed in the organic EL device in order to maintain stable emitting characteristics which are not affected by water or oxygen for a long period of time.

2. Description of the Prior Art

In general, the organic EL has an emitting part having a laminate structure which is formed by interposing a thin film of organic EL layer containing phosphor organic compound between an anode and a cathode. A hole and an electron are injected into the phosphor organic compound to recombine to generate an exciton. The organic EL device is a spontaneous light-emitting device using emission of light (fluorescence/phosphorescence) when the exciton is inactivated.

It is generally known that a principal problem of the organic EL device is an improvement of the durability of the light emitting part. One of the causes of short lifetime is generation of non-light emitting dot which is called "dark spot." The non-light emitting dot grows with lapse of time of lighting and the area of the non-light emitting portion enlarges gradually. As a result, the luminance of the light-emitting area decreases. When the diameter of the non-light emitting portion grows up in several tens $\mu$m and above, the non-light emitting portion can be visually observed and damages the lifetime of product. It is recognized that a principal cause of the generation of the dark spot is that an organic EL layer constituting the organic EL device reacts with moisture or oxygen in a sealed container to generate and grow the dark spot.

It is, therefore, necessary that the materials constituting the organic EL device do not contain moisture. More particularly, the organic materials used in the emitting part and the sealed container must be processed so as to not contain the moisture. Thus, the organic EL device has been manufactured by a dry process in which the moisture is removed to the utmost from a vacuum container at the time of forming a film or production processes such as a sealing process of the device. However, it is not possible to prevent the dark spot from generating and growing in the EL device at present, because the moisture can not be removed completely.

As described above, the principal problem for the organic EL device is that the moisture inside the container is removed completely to eradicate the dark spot or a small dark spot is not made to grow so as to prolong the life of the EL device. As one of the measures for removing the moisture, a commercially available organic EL device uses an inorganic drying agent as a drying member in a container and seals the container. These techniques were applied for patent and publicly known (for example, Unexamined Patent Publication (Kokai) No. 9-148066.)

Figure 4:
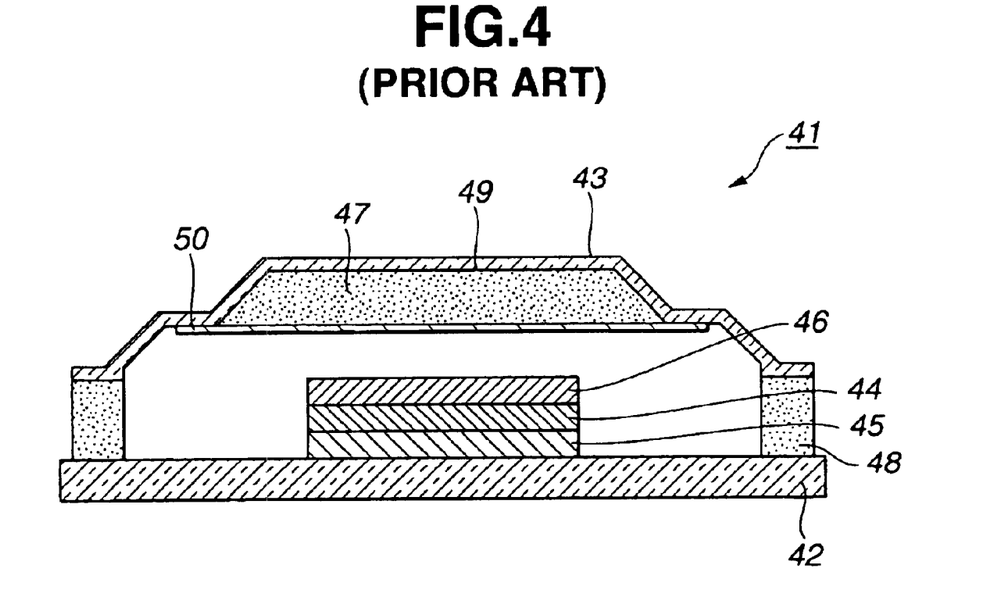
FIG. 4 is a side cross section showing the structure of an organic El device of a prior art.

FIG. 4 is a side cross sectional view showing the structure of a conventional organic EL device using drying agent as a drying member. The organic EL device 41 has a structure in which a transparent conductive film of ITO(Indium Tin Oxide) is formed on the transparent glass board 42 in a given pattern to form the anode 45.

The organic EL layer 44 of a thin film of organic compound is formed on the anode 45. The cathode 46 of metal thin film of, for example Al—Li, is formed on the upper surface of the organic EL layer 44, and a light emitting part of a laminate comprising the anode 45, organic EL layer 44 and cathode 46 is formed. The organic EL layer 44 is comprised of a hole injection layer containing at least an organic emitting layer, a hole transportation layer, an electron transportation layer, an electron injection layer etc. which are required for EL light emission.

Outer peripheral portion of the glass board 42 is bonded and sealed with the metal sealing cap 43 by means of adhesive 48. The metal sealing cap 43 seals hermetically the anode 45, organic EL layer and cathode 46 on the glass board in an atmosphere of inert gas from which the moisture is removed to the utmost such as dried nitrogen or in a dried atmosphere by dry air so that they are shield hermetically from the air and the moisture.

The recessed area 49 is formed in the inner surface of the metal sealing cap 43 by, for example, press molding. The recessed area 49 contains powdered inorganic drying agent 47 such as barium oxide, calcium oxide, as a drying means. The recessed area 49 containing powdered drying agent 47 is covered by the cap 50. The drying agent placed inside the recessed area 49 adsorbs the moisture remaining in the container to form hydroxide, thereby removing the moisture remaining inside the container or the moisture permeated from the outside.

However, in the case of the conventional organic EL device 41 shown in FIG. 4, the inorganic drying agent 47 contained in the recessed area 49 formed in the metal sealing cap 43 is powdered. Accordingly, if the calcium oxide powder of the drying agent 47 falls on the cathode 46 of the emitting part to adhere to it, aluminum and calcium oxide reacts with water on the cathode, which results in generation of corrosion of thin film cathode 46 made of aluminum. In order to resolve such a problem, the recessed area 49 containing the drying agent 47 must be covered with the water penetrating cap 50 to isolate the drying agent 47 from the emitting part so that the calcium oxide as a drying agent does not adhere to the cathode.

The cap 50 must be placed inside a sealed container. Therefore, the metal sealing cap 43 used has a special shape, thereby complicating the structure. Further, a large space is required for sealing the drying agent and the thickness of the sealing cap 43 must be large. As a result, the entire thickness of the organic EL device becomes large.

Further, since the drying agent 47 is powder, the drying agent 47 is hard to handle so as to prevent contamination by adhesion to the organic EL layer when confining the drying agent 47 in the recessed area 49 of the metal sealing cap 43. That is to say, such conventional powdered drying agent is extremely poor in workability. Further, there has been a problem that air incorporated between powders of the drying agent causes a dark spot to grow due to oxygen in air.

Furthermore, if the generation of the dark spot in the vicinity of the central portion of a display area can be suppressed by a drying member of the sealing cap 43, the generation and growth of the dark spot caused by water permeated from an adhesive layer in the peripheral portion near the sealing part can not be sufficiently suppressed. This is because the sealing part in the peripheral portion of the organic EL device is distant from the drying agent 47 and that it is difficult to select adhesive reliable for different types of materials in the case of bonding the metal cap 43 with the glass board 42.

The inventors have proposed a Japanese patent application which is published by the Unexamined Japanese Patent Publication No. 2002-33187 in order to resolve the conventional problems. The patent application discloses a water capturing medium which can capture the moisture effectively by virtue of chemical reaction without containing oxygen and can suppress the generation and growth of the dark spot in the peripheral portion of organic EL device to form effectively by the use of an organometallic compound highly reactive to the moisture instead of the conventional drying agent.

Figure 3:
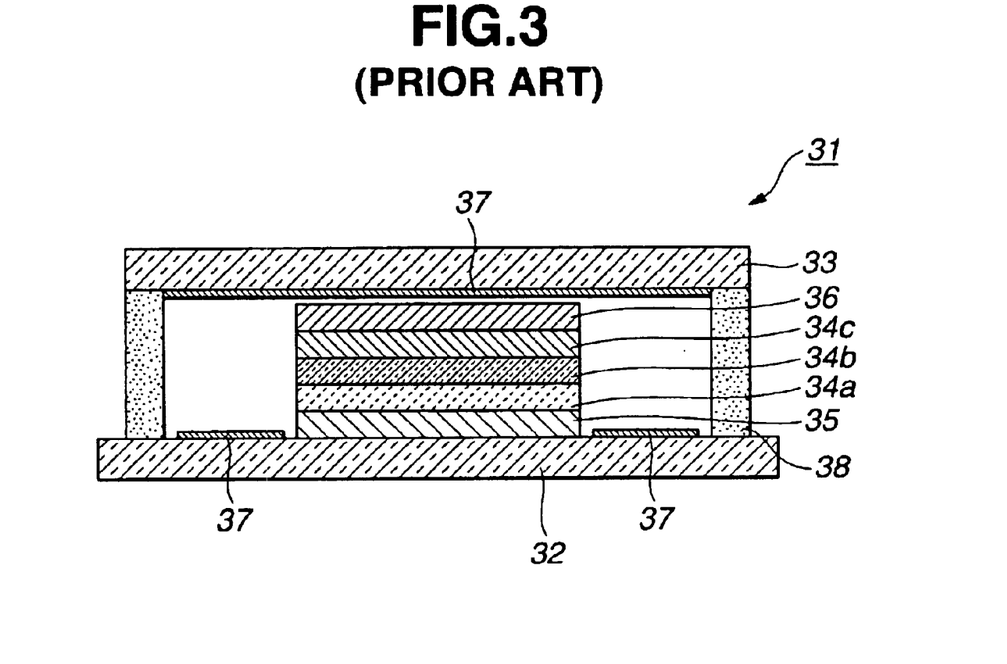
FIG. 3 is a side cross section showing the structure of an organic El device of prior art.

As shown in FIG. 3, the EL device disclosed in the Unexamined Japanese Patent Publication No. 2002-33187 has a structure of a light emitting area in which the organic emitting layer 34 of an organic EL device is interposed between the anode electrode 35 and the cathode electrode 36 placed opposite to each other on the glass substrate 32. The organic emitting layer has a three-layered structure having the hole injection layer 34a, hole transportation layer 34b and emitting layer-electron transportation layer 34c. The organic emitting layer 34 is placed in a hermetically sealed container formed of the glass substrate 32, sealing cap 33 and sealing part 38. In the hermetically sealed container is placed the water capturing layer 37 to prevent the lamination 34 of the organic EL materials from being contaminated with the moisture. The water capturing layer comprises a film of an organometallic compound represented by the formulae (1) (2) and (3).

Formula 1 wherein R is one selected from the group consisting of alkyl group, alkenyl group, aryl group, cycloalkyl group, heterocyclic group and acyl group having at least one carbon atom, M is a trivalent metal atom, and n is an integer of more than one.

Formula 2 wherein each of $R_1$, $R_2$, $R_3$, $R_4$ and $R_5$ is one selected from the group consisting of alkyl group, alkenyl group, aryl group, cycloalkyl group, heterocyclic group and acyl group having at least one carbon atom, and M is a trivalent metal atom.

Formula 3 wherein each of $R_1$, $R_2$, $R_3$ and $R_4$ is one selected from the group consisting of alkyl group, alkenyl group, aryl group, cycloalkyl group, heterocyclic group and acyl group having at least one carbon atom, and M is a tetravalent metal atom.

Figure 5:
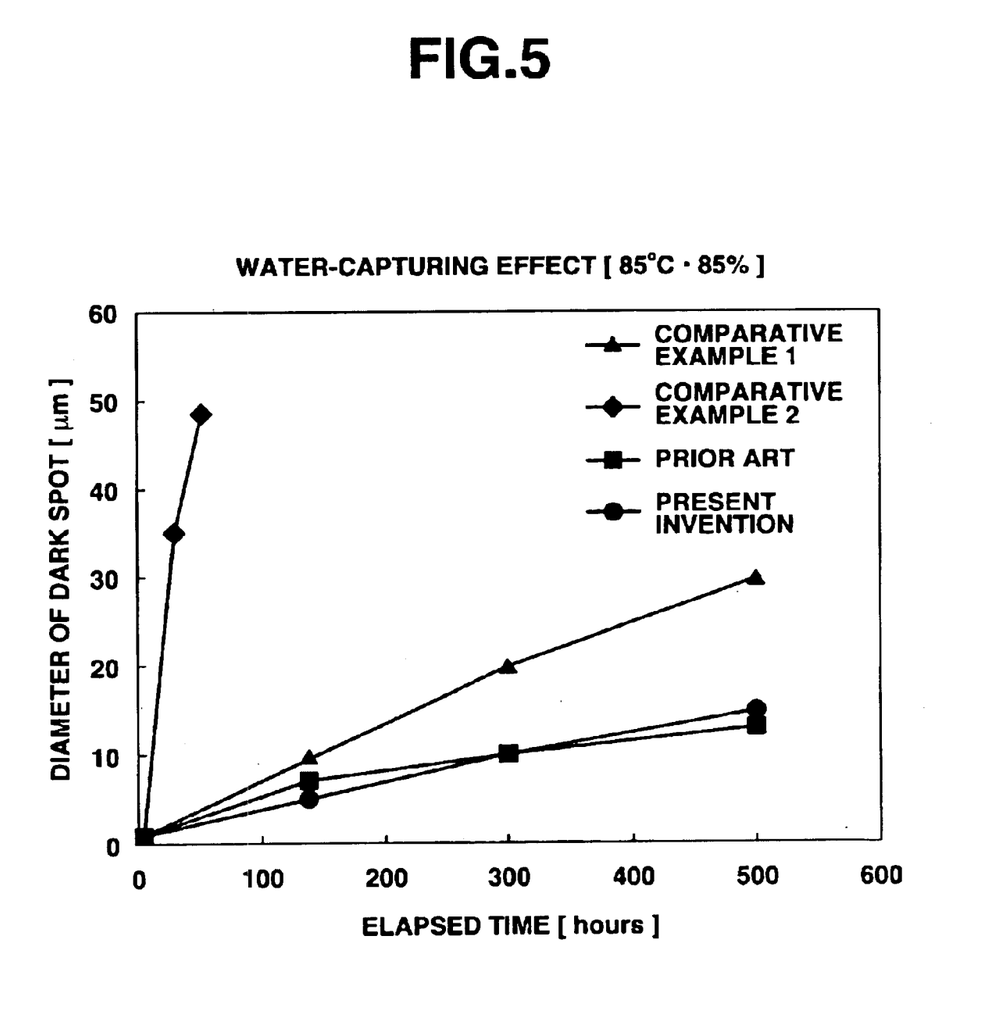
FIG. 5 is a graph showing the growth of dark spot in the present invention, prior art and comparative examples.

The organometallic compound represented by the formulae (1) (2) and (3) is soluble in an organic solvent and liquid at the time of being used. It is applied to the whole inner surface of the sealing cap 33 of flat glass plate to form a water-capturing film 100 μm in thickness used for a water-capturing medium layer. Alternatively, a sealing cap is prepared by forming a recessed area 0.2 to 0.25 mm in depth in the glass board 33 by spot facing, inside of which is formed a water-capturing layer. After an accelerated life test was carried out for the conventional organic EL device at a temperature of 85° C. and humidity of 85%, the growth of dark spot was observed by a microscope. As a result, while the diameter of the dark spot was 1 μm at an initial stage, it was grown slightly up to 10 μm at a central portion after a lapse of 500 hours as shown in FIG. 5. The diameter of the dark spot 10 μm and below can not be visually observed. Accordingly, such an organic EL device had no problem in practical use and was effective.

However, in the case of the sealing cap 33 of flat glass plate of prior art shown in FIG. 3, the solution of the organometallic compounds represented by the formulae (1) (2) and (3) constituting the water-capturing medium layer is diluted by an organic solvent and lipophilic. Since a glass plate is hydrophilic, the water-capturing medium is not compatible with the glass. Accordingly, when the lipophilic water-capturing medium is applied on the hydrophilic glass plate, the water-capturing medium becomes droplets due to surface tension. It was, therefore, not easy to form a thin film pattern. Accordingly, there has been conventionally adopted a method in which the whole of a glass plate is dipped in a solution of water-capturing medium. According to such a method, however, the water-capturing medium is formed in the sealing part of the peripheral portion of the sealing cap. Therefore, such a method has a problem that water permeates from the sealing part after being sealed, and a process for removing the water-capturing medium of the sealing area is required.

On the other hand, there is a proposal that a recessed area is formed in the sealing cap of glass by spot facing processing in order to resolve the above problems. It is, however, necessary to form a recessed part in the portion other than sealing part by a sandblast method or etching method in addition to the space facing. Such a method has problems that long processing time is required and that it not only adversely affects on health of workmen, but also requires management and processing of waste liquor, because the strong acid of hydrofluoric acid is used for etching glass. Further, a part of glass plate is cut or scratched by such a spot facing processing. It is, therefore, necessary to prepare a thicker glass plate in advance, because the thickness of the glass sealing cap decreases and the mechanical strength decreases. Therefore, this method is not advantageous in that the total thickness of the organic EL device becomes large and that costs such as material cost, manufacturing cost rise drastically.

SUMMARY OF THE INVENTION

The present invention has been made on the basis of the findings that the water-capturing medium layer is lipophilic and that the organic pigment used in the organic EL device is also lipophilic making us of patterning a thin film which has been technologically completed in the field of the organic EL device.

Accordingly, an object of the present invention is to provide a thin-profile organic EL device in which a water-capturing medium is placed by a simple process irrespective of the sealing part, because a lipophilic water-capturing medium layer of organic pigment is formed in a given pattern in the inner surface of hydrophilic sealing cap, in which is placed a thin film of lipophilic water-capturing medium.

According to the present invention, there is provided an organic EL device comprising a sealed container having a glass substrate and a sealing cap bonded to the glass substrate. The sealed container is provided with a light emitting region formed on the substrate which is formed of organic EL material layers placed between a pair of opposite anode and cathode electrodes. The sealed container further includes a water-capturing medium holding layer provided on an inner surface of the container spaced apart from the light emitting region and a water-capturing medium holding layer.

According to the present invention, there is also provided an organic EL device, in which the sealing cap is comprised of a hydrophilic material.

According to the present invention, there is also provided an organic EL device, in which the hydrophilic material is a plate glass.

According to the present invention, there is also provided an organic EL device, in which the water-capturing medium holding layer and water-capturing medium are comprised of a thin film of lipophilic material.

According to the present invention, there is also provided an organic EL device, in which the water-capturing medium holding layer is comprised of lipophilic organic pigment.

According to the present invention, there is also provided an organic EL device, in which the organic pigment is selected from the group consisting of lake pigment, azolake pigment, insoluble azo pigment, condensed azo pigment, azo complex pigment, phthalocyanine pigment, condensed polycyclic pigment and fluorescent pigment.

According to the present invention, there is also provided an organic EL device, in which the water-capturing medium layer is comprised of thin film of organometallic compound represented by the formula (1):

(1)

[wherein R is a group selected from the group consisting of alkyl group, aryl group, cycloalkyl group, heterocyclic group and acyl group having one or more of carbon atoms. M is a trivalent metallic atom and n is an integer of one and above.]

According to the present invention, there is also provided an organic EL device, in which the water-capturing medium layer is comprised of an organometallic complex compound represented by the following formula (2):

(2)

[wherein R1, R2, R3, R4 or R5 are group selected from the group consisting of alkyl group, aryl group, cycloalkyl group, heterocyclic group and acyl group having one or more of carbon atoms. M is a trivalent metallic atom.]

According to the present invention, there is also provided an organic EL device, in which the water-capturing medium layer is comprised of an organometallic complex compound represented by the following chemical formula (3):

(3)

[wherein R1, R2, R3 or R4 is a group selected from the group consisting of alkyl group, aryl group, cycloalkyl group, heterocyclic group and acyl group having one or more of carbon atoms. M is a quadrivalent metallic atom.]

According to the present invention, there is also provided an organic EL device, in which the water-capturing medium layer is a film formed by applying water-capturing medium layer forming liquid prepared by dispersing an inorganic drying medium in an organic solvent.

According to the present invention, there is also provided an organic EL device, in which the water-capturing medium layer is a mixture or combination of an inorganic drying medium with the organic water-capturing medium.

BRIEF DESCRIPTION OF THE DRAWINGS

These and other objects and advantages of the present invention will become clear from the following description with reference to the accompanying drawings, in which.

DETAILED DESCRIPTION OF THE PREFERRED EMBODIMENT

Figure 1:
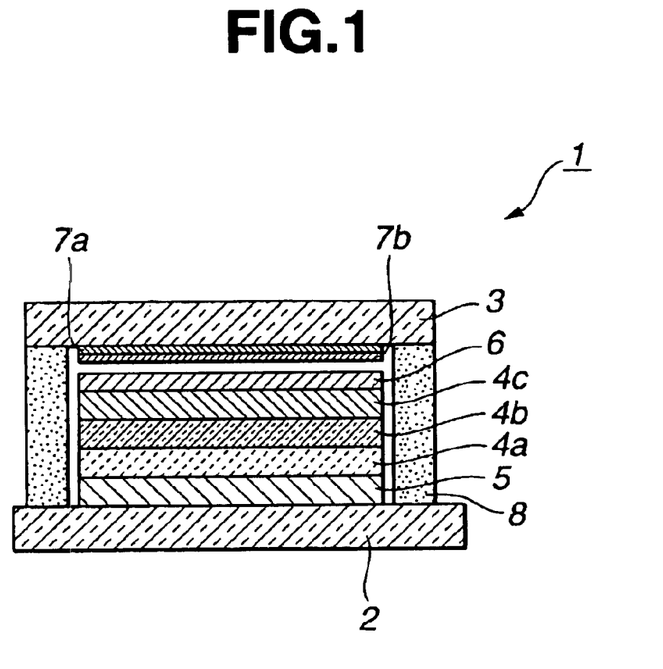
FIG. 1 is a side cross section showing an embodiment of the present invention.
Figure 2:
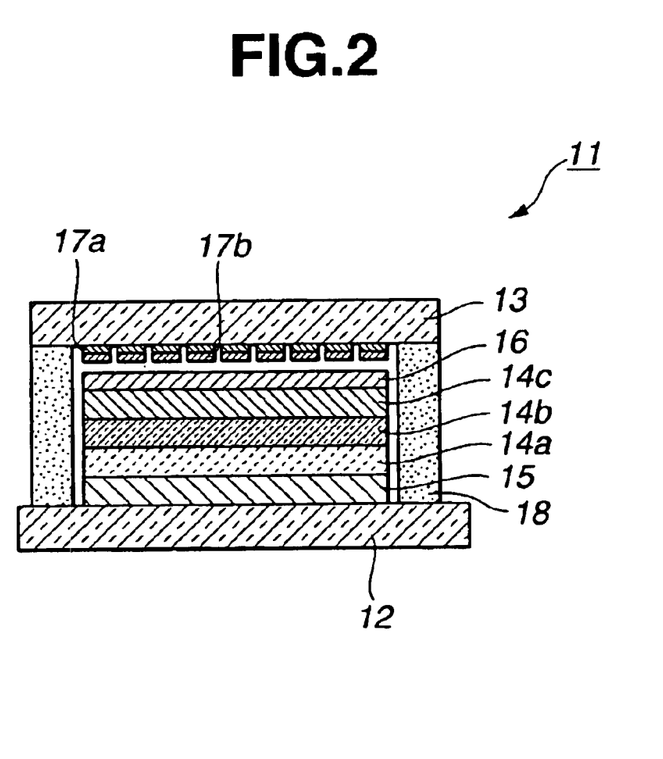
FIG. 2 is a side cross section showing an embodiment of the present invention.

FIGS. 1 and 2 are side cross sectional view showing preferred embodiments of an organic EL device of the present invention.

As shown in FIG. 1, the organic El device 1 comprises the glass substrate 2 of rectangular plate glass having insulating property and transparency. The anode 5 is formed in the inner surface of the glass substrate 2 in a pattern formation by transparent conductive material. As the transparent conductive material, for example ITO film is formed on the whole surface of the glass substrate 2 by PVD (Physical Vapor Deposition) method such as vapor deposition method, sputtering method and the like. After that, patterning is performed in the shape of anode by means of photolithography to form the anode 5. A part of the anode 5 is lead to the end of the glass substrate 2 to form a lead electrode which is connected to a driving circuit (not shown.)

The organic EL layer of thin film of organic compound is laminated to the upper surface of the anode 5 by PVD method such as a molecular beam evaporation method, resistive heating method and the like. The organic EL layer 4 shown in FIG. 4 has a three-layered structure comprising the hole injection layer 4a of copper phthalocyanine (CuPc) which is a film several tens nm (10 nm) in thickness formed on the anode 5, the hole transportation layer 4b of Bis((N-(1-naphtyl-n-phenyl))benzidine(α-NPD) which is a film several tens nm (10 nm) in thickness formed on the upper surface of the hole injection layer 4a, and the emitting layer-electron transportation layer 4c of tris (8-quinolilat) aluminum (Alq3) which is a film several tens nm (10 nm) in thickness formed on the upper surface of the hole transportation layer 4b. A light emitting part is formed by a laminate having a five-layered structure comprising the anode 5, the organic EL layer 4 and the cathode 6 described later.

As shown in FIG. 1, the cathode 6 is a thin film of metal formed on the upper surface of the organic EL layer 4 (Alq3 4c). The material for the metal thin film is a simple substance of metal having a small work function such as Al, Li, Mg, In, etc. or alloy having a small work function such as Al—Li, Mg—Ag, etc. The thickness of the film of the cathode 6 is in the range of several tens nm (10 nm) to several hundreds nm (100 nm), preferably in the range of 50 nm to 200 nm. A part of the cathode is lead to the end of the glass board 2 to form a lead electrode which is connected to a driving circuit (not shown.)

On the other hand, the sealing cap 3 of rectangular plate glass is placed opposite to the glass substrate 2. A sealing part of, for example, ultra-violet curing adhesive is formed on the outer periphery of the sealing cap by a sealing process described later. A water-capturing member is placed in the inner surface of the sealing cap other than the sealing part. The water-capturing member has a two-layered laminate comprising the water-capturing medium holding layer 7a and the water-capturing medium layer 7b.

The material for the water-capturing medium layer 7b is not compatible with the plate glass because the former is lipophilic and the latter is hydrophilic. It is hard to form a thin film of the material for the water-capturing medium layer 7b on the glass board. Therefore, the water-capturing medium holding layer 7a having the lipophilic properties is formed inside the plate glass sealing cap 3 in pattern formation. The material for the water-capturing medium holding layer 7a is selected from the group consisting of lake pigment, azolake pigment, insoluble azo pigment, condensed azo pigment, azo complex pigment, phthalocyanine pigment, condensed polycyclic pigment and fluorescent pigment. The film of the organic compound is formed in a given pattern by inside the sealing cap 3 by PVD method such as molecular beam evaporation, resistive heating method and the like.

The organic pigment having lipophilic properties is described below more in detail. Examples of lake pigment are Alizarine lake, rhodamine lake, quinoline yellow lake, etc. Examples of the azolake pigment are Lake Red C, Brilliant Carmine 6B, Permanent Red 2B, etc. Examples of the insoluble azo pigment are Fast Yellow, Disazo Yellow, Naphthol Red, etc. Examples of the condensed azo pigment are Cromophtal Yellow, Cromophtal Red, etc. Examples of the azo complex pigment are Nickel Azo Yellow, benzimidazolone yellow, etc. Examples of the phthalocyanine pigment are Phtalocyanine Blue, Phtalocyanine Green etc. Examples of the condensed polycyclic pigment are thioindigoid, perylene red (Paliogen Red), dioxazine violet, quinacridone red, anthraquinone, isoindolinone, azomethibe, etc. These pigments function as the water-capturing medium holding layer 7a for the prime coat of for the water-capturing medium layer and simultaneously function as a color filter when containing a large quantity of pigment component.

The water-capturing medium layer 7b as a water-capturing member is formed in the shape of thin film on the surface of the water-capturing medium holding layer 7a. Since the surface of the water-capturing agent holding layer 7a is lipophilic, a solution of the organometallic compound of the water-capturing material having lipophilic properties can be spread out over only the surface of the water-capturing medium holding layer 7a only by dropping. Thereby, a thin film can be easily formed.

The sealing process is carried out in such a manner as described hereinafter. An adhesive of, for example ultra-violet curing resin is applied as the sealing member 8 to the outer periphery of the rectangular sealing cap 3 in an atmosphere of inert gas from which is removed the moisture to the utmost (for example dried nitrogen) or in a dry atmosphere by dry ice, thereby hermetically sealing the glass board 2 with the sealing cap 3 by the sealing member 8. The sealing cap 3 protects the anode 5, the organic EL layer 4 and the cathode 6.

The water-capturing medium layer 7b is formed of a thin film of the organometallic compound. The reaction of a chelate-type metal complex as an example of the organometallic compound containing aluminum with water proceeds by the following reaction formula (4):

As shown in the reaction formula (4), three alkoxy groups are liberated from the aluminum complex and reacted with three hydroxyl groups of the water. It is therefore concluded that the aforementioned compound can be used as a water-capturing medium, chemically removing the moisture.

The reaction of a chelate-type metal complex of metal other than the aforementioned aluminum metal complex with water proceeds by the following reaction formula (5):

As shown in the reaction formula (5), the organic compound corresponding to the valence of the metal is liberated and reacted with n hydroxyl groups. Therefore the compound illustrated by formula (1) can also be used as a water-capturing medium removing chemically the moisture.

In a similar fashion to the above, the present inventors have discovered that the organometallic compound illustrated by the formula (1) adsorbs water molecule by hydrolysis, that is, the moisture in the periphery of the organic EL element reacts with the organometallic compound to separate M—O bond of 2n-member ring, and H and OH of the water molecule are reacted to form hydroxyl (OH) bond. The present inventors have discovered also that since one mole of the organometallic compound illustrated by the formula (1) reacts with three moles of water molecule to form hydroxide, the organometallic compound illustrated by the formula (1) has an adsorbing action on the moisture. The present inventors have conceived that the organometallic compound illustrated by the formula (1) has the action and principle upon which the organometallic compound illustrated by the formula (1) can be used as a water-capturing medium for the organic EL element and have discovered that the organometallic compound illustrated by the formula (1) is effective for capturing water. Examples of R of the formula (1) are described below but not limited thereto:

R is one selected from the group consisting of an alkyl group, alkenyl group, aryl group, cycloalkyl group, heterocyclic group and acyl group having at least one carbon atom. Alkyl group may be substituted or non-substituted and may be exemplified by a methyl group, ethyl group, propyl group, butyl group, sec-butyl group, pentyl group, hexyl group, heptyl group, octyl group, nonyl group, decyl group, undecyl group, dodecyl group, tridecyl group, tetradecyl group, pentadecyl group, hexadecyl group, heptadecyl group, octadecyl group, nonadecyl group, icosyl group, heneicosyl group, docosyl group, and the like and is preferably those having more than eight carbon atoms. Examples of substituted or non-substituted alkyl group are preferably those described below and an oligomer or polymer thereof may be used. Alkenyl group may be a vinyl group, allyl group, butenyl group, pentenyl group, hexynyl group and the like, and examples of substituted or non-substituted alkenyl group having eight or more carbon atoms may be preferably those described below. The oligomer or polymer thereof may be also used.

Aryl group may be substituted or non-substituted and may be exemplified by a phenyl group, tolyl group, 4-cyanophenyl group, biphenyl group, o,m,p-terphenyl group, naphthyl group, anthranyl group, phenanthrenyl group, fluorenyl group, 9-phenylanthranyl group, 9,10-diphenylanthranyl group, pyrenyl group, and the like and may be preferably those having eight or more carbon atoms. The oligomer or polymer thereof may be used.

Examples of substituted or non-substituted alkoxy group may be a methoxy group, n-butoxy group, tert-butoxy group, trichloromethoxy group, trifluoromethoxy group, and the like and may be preferably those having eight or more carbon atoms. The oligomer or polymer thereof may be used.

Examples of substituted or non-substituted cycloalkyl group may be a cyclopentyl group, cyclohexyl group, norbornane group, adamantane group, 4-methylcyclohexyl group, 4-cyanocyclohexyl group and the like and may be preferably those having eight or more carbon atoms. The oligomer or polymer thereof may be used.

Examples of substituted or non-substituted heterocyclic group may be a pyrrole group, pyrroline group, pyrazole group, pyrazoline group, imidazole group, triazole group, pyridine group, pyridazine group, pyrimidine group, pyrazine group, triazine group, indole group, benzimidazole group, purine group, quinoline group, isoquinoline group, cinorin group, quinoxaline group, benzquinoline group, fluorenone group, dicyanofluorenone group,carbazole group, oxazole group, oxadiazole group, thiazole group, thiadiazole group, benzoxazole group, benzothiazole group, benzotriazole group, bisbenzooxazole group, bisbenzothiazole group, bisbenzoimidazole group and the like. The oligomer or polymer thereof may be used.

Examples of substituted or non-substituted acyl group may be a formyl group,acetyl group, propionyl group, butyryl group, isobutyryl group, valeryl group, isovaleryl group, pivaloyl group, lauroyl group, myristoyl group, palmitoyl group, stearoyl group, oxalyl group, malonyl group, succinyl group, glutaryl group, adipoyl group, pimeloyl group, suberoyl group, azelaoyl group, sebacoyl group, acryloyl group, propioloyl group, methacryloyl group, crotonoyl group, isocrotonoyl group, oleoyl group, elaidoyl group, maleoyl group, fumaroyl group, citraconoyl group, mesaconoyl group, camphoroyl group, benzoyl group, phthaloyl group, isophthaloyl group, telephthaloyl group, naphthoyl group, toluoyl group, hydroatropoyl group, atropoyl group, cinnamoyl group, furoyl group, thenoyl group, nicotynoyl group, isonicotynoyl group, glycoloyl group, lactoyl group, glyceroyl group, tartronoyl group, maloyl group, tartharoyl group, tropoyl group, benziloyl group, salicyloyl group, anisoyl group, vaniloyl group, veratroyl group, piperonyloyl group, orotocatechoyl group, galloyl group, glyoxyloyl group, pyruvoyl group, acetoacetyl group, meso-oxalyl group, meso-oxalo group, oxalacetyl group, oxalaceto group, levulinoyl group, and the like. These acyl groups may be substituted with fluorine, chlorine, bromine, iodine and the like. The number of carbon atoms of the acyl group may be preferably eight and above. The oligomer or polymer thereof may be used.

Examples of the organometallic compound in which R is substituted with one of the above-described substituents and trivalent metal is aluminum are those represented by formulae (6), (7) and (8):

Formula 6

Formula 7

Formula 8

Further, the present inventors have discovered that the organometallic compound illustrated by the formula (2) captures water molecule by hydrolysis, that is, the moisture in the periphery of the organic EL element reacts with the organometallic compound to separate M—O bond of 2n-member ring, and H and OH of the water molecule are reacted to form hydroxyl (OH) bond. The present inventors have discovered also that since one mole of the organometallic compound illustrated by the formula (2) reacts with three moles of water molecules to form hydroxide, the organometallic compound illustrated by the formula (2) has an adsorbing action on the moisture. The present inventors have conceived that the organometallic compound illustrated by the formula (2) has the action and principle upon which the organometallic compound illustrated by the formula (2) can be used as a water-capturing medium for the organic EL element and have discovered that the organometallic compound illustrated by the formula (2) is effective for capturing water. Examples of $R_1$, $R_2$, $R_3$, $R_4$ and $R_5$ of the formula (2) are the same as R of the formula 1 but not limited thereto. Therefore, the description of $R_1$, $R_2$, $R_3$, $R_4$ and $R_5$ of the formula (2) will be omitted.

Examples of the organometallic compound in which each of $R_1$, $R_2$, $R_3$, $R_4$ and $R_5$ is substituted with one of the above-described substituents and trivalent metal is aluminum are organometallic complex compound represented by formulae (9), (10), (11) and (12):

Formula 9

General Formula of Chelope

Formula 10

Aluminum-di-2-ethylhexyloxide-mono-Ethyl aceto acetate Chelope-EH-2

Formula 11

Aluminum-di-2-methylnonyloxide-mono-Ethyl aceto acetate Chelope C10-2

Formula 12

Aluminum-di-n-lauriloxide-mono-Ethyl aceto acetate Chelope C12-2

An example of the organometallic compound in which the trivalent metal is lanthanum is the organometallic complex compound represented by the formula (13):

lanthanum complex

An example of the organometallic compound in which the trivalent metal is yttrium is the organometallic complex compound represented by the formula (14):

yttrium complex

An example of the organometallic compound in which the trivalent metal is gallium is the organometallic complex compound represented by the formula (15):

gallium complex

Further, the present inventors have discovered that the organometallic compound represented by the formula (3) captures water molecule by hydrolysis, that is, the moisture in the periphery of the organic EL element reacts with the organometallic compound to separate M—O bond of 2n-member ring, and H and OH of the water molecule are reacted to form hydroxyl (OH) bond. The present inventors have discovered also that since one mole of the organometallic compound represented by the formula (3) reacts with three moles of water molecule to form hydroxide, the organometallic compound represented by the formula (3) has an adsorbing action on the moisture. The present inventors have conceived that the organometallic compound represented by the formula (3) has the action and principle upon which the organometallic compound represented by the formula (3) can be used as a water-capturing medium for the organic EL element and have discovered that the organometallic compound represented by the formula (3) is effective for capturing water. Examples of $R_1$, $R_2$, $R_3$, and $R_4$ of the formula (3) are the same as R of the formula (1) but not limited thereto. Therefore, the description of $R_1$, $R_2$, $R_3$ and $R_4$ of the formula (3) will be omitted.

An example of the organometallic compound in which each of $R_1$, $R_2$, $R_3$ and $R_4$ is substituted with one of the above-described substituents and tetravalent metal is germanium is the organometallic complex compound represented by formula (16):

germanium complex

An example of the organometallic compound in which R is substituted with the above-described substituents and tetravalent metal is silicon is the organometallic complex compound represented by formula (17):

silicon complex

The water-capturing medium film 7 is formed as a water adsorbent on the inner surface of the sealing cap 2. As the water-capturing medium film 7 may be considered several types of structures as described below. First, the water-capturing medium film 7 can be composed of only an organometallic compound represented by the formulae (1), (2) or (3) and other organometallic compounds. Since the water capturing medium film 7 made of the organometallic compound represented by the formulae (1), (2) or (3) and other organometallic compounds is obtained as solution of aromatic organic solvent such as toluene, xylene and the like or aliphatic organic solvent in which is dissolved the organometallic compound containing n-valent metal, the solution is applied to the inner surface of the substrate 3 by, for example, printing method, coating method, and the like to form the film. The water-capturing medium film 7 is not formed on the glass substrate exposed around the outer peripheral area of the sealing cap due to the difference in wettability between the water-capturing medium supporting layer and the hydrophobic glass substrate.

Further, the water-capturing medium film 7 can be formed by adding an inorganic drying medium into the water-capturing medium film of the organometallic compound represented by the formulae (1), (2) or (3) and other organometallic compounds. As the drying medium to be added into the water-capturing medium film may be a drying medium adsorbing chemically the water molecule (chemical adsorption) or adsorbing physically the water molecule (physical adsorption) or any other drying medium.

For the drying medium adsorbing chemically the water molecule (chemical adsorption), its water-capturing efficiency can be significantly improved by using a dispersing one selected from the group consisting of metallic oxide, sulfate, metal halide, perchlorate and metal in the solution of aromatic organic solvent such as toluene, xylene and the like or aliphatic organic solvent in which is dissolved the organometallic compound represented by the formulae (1), (2) or (3) and other organometallic compounds.

An alkaline metal oxide may be exemplified by sodium oxide ($Na_2O$) and potassium oxide ($K_2O$). An alkaline earth metal oxide may be exemplified by calcium oxide (CaO), barium oxide (BaO) and magnesium oxide (MgO). The aforementioned sulfate may be lithium sulfate ($Li_2SO_4$), sodium sulfate ($Na_2SO_4$), calcium sulfate ($CaSO_4$), magnesium sulfate ($MgSO_4$), cobalt sulfate ($CoSO_4$), gallium sulfate ($Ga_2SO_4$), titanium sulfate ($Ti(SO_4)_2$), nickel sulfate ($NiSO_4$) and the like. For these salts may be preferably used anhydrides.

The aforementioned halides may be calcium chloride ($CaCl_2$), magnesium chloride ($MgCl_2$), strontium chloride ($SrCl_2$), yttrium chloride ($YCl_2$), copper chloride ($CuCl_2$), cesium fluoride (CsF), tantalum fluoride ($TaF_5$), niobium fluoride ($NbF_5$), calcium bromide ($CaBr_2$), cerium bromide ($CeBr_2$), selenium bromide ($SeBr_4$), vanadium bromide ($VBr_2$), magnesium bromide ($MgBr_2$), barium iodide ($BaI_2$), magnesium iodide ($MgI_2$) and the like. For these metal halides may be preferably used anhydrides.

The aforementioned perchlorate may be barium calcium perchlorate ($Ba(ClO_4)_2$) and magnesium perchlorate ($Mg(ClO_4)_2$). For these perchlorates may be preferably used anhydrides. The drying efficiency of the drying agent for adsorbing physically the water molecule (physical adsorption) can be improved moreover by using by dispersing one selected from the group consisting of zeolite, silica gel, activated alumina, titanium oxide, carbon, carbon nanotube and fullerrene in the solution of aromatic organic solvent such as toluene, xylene and the like or aliphatic organic solvent in which is dissolved the organometallic compound illustrated by the formulae (1), (2) or (3) and other organometallic compounds.

EXAMPLES

In the following examples are described several preferred embodiments to illustrate the present invention. However, it is to be understood that the present invention is not intended to be limited to the specific embodiments.

Example 1

As shown in FIG. 1, the organic EL device 1 is comprised of a sealed container which is formed by sealing hermetically the rectangular flat plate of glass substrate 2 with the glass-made sealing cap 3 placed opposite to the glass substrate 2 by means of adhesive 8 of sealing part. The 200 nm thick anode 5 by ITO film as a transparent conductive material were formed by a sputtering method on the whole surface of the glass substrate 2 which was a part of the sealing container. Patterning is performed in the shape of anode by a photolithography method to form the anode 5. A part of the anode 5 as an electrode was lead to the end of the glass substrate 2, which was connected as a lead electrode to a drive circuit (not shown).

An organic emitting layer was formed on the top surface of the anode 5. The organic emitting layer has a three-layer laminated structure comprising the hole injection layer 4a, the hole transportation layer 4b and the emitting-electron-transportation layer 4c. The hole injection layer 4a was formed by making a 70 nm thick film of copper phthalocyanine (CuPc) on the top surface of the anode 5 by the resistive heating method. The hole transportation layer 4b was formed by making a 30 nm thick film of Bis(N-(1-n-phenyl)benzidine($\alpha$-NPD) on the top surface of the hole injection layer 4a. The emitting-electron-transportation layer 4c was formed by making a 60 nm thick film of tris (8-quinolinolat) aluminum (Alq3) on the top surface of the hole transportation layer 4b. Next, the cathode 6 was formed by making a 200 nm thick film of Al—Li alloy by a co-vacuum evaporation method. A part of the cathode was lead to the end of the glass substrate 2, which was connected to a drive circuit (not shown).

Next, the sealing cap 3 was formed on the rectangular plate glass, which comprises a peripheral sealing part and a water-capturing member inside the sealing part. The water-capturing member comprises a water-capturing medium supporting layer and a water-capturing medium layer at a coated area other than the sealing part. The water-capturing medium supporting layer is formed by patterning 3 nm thick film of phthalocyanine blue (CuPc) which was one example of phthalocyanine pigment by a mask-exposure by means of a resistive heating method. Only 48 wt % solution of aluminum oxide octylate ("OLIVE AOO" trade name for HOPE PHARMACEUTICAL CO., LTD. illustrated by the formula 6 which is one of the organometallic compound illustrated by the formula 1 was applied on the surface of the supporting layer for water-capturing medium in a dried atmosphere of dried air from which water was removed to the utmost by means of an applying method such as a printing method, dropping method and the like. According to such a manner as described above, a transparent film of the organometallic compound was formed as the water-capturing means.

The glass substrate on which was formed the organic EL device emitting layer and the plate glass-made cap were placed opposite each other in a dried atmosphere of dried air from which water was removed to the utmost, coated with ultraviolet-curing epoxy resin 8 so that the thickness of the sealing part is 30 nm and dried to seal.

After sealing, aging was carried out by heating at 100° C. for one hour to accelerate the reaction with water.

An accelerated life test was carried out to an emitting part of the organic EL device thus obtained at a temperature of 85° C. and humidity of 85% and the growth of dark spot was observed by a microscope. As a result, as shown in FIG. 5, while the diameter of the dark spot was 1 $\mu$m at the initial stage, there was observed a slight increase in the diameter up to 10 $\mu$m at the central portion of the organic EL device after a lapse of 500 hours. Since the diameter of the dark spot of 10 $\mu$m and below can not be visually observed, there is no problem in practical use. Further, the growth of the dark spot at the peripheral portion of the organic EL device was inhibited similarly to the central portion of the organic EL device. It is supposed that 500 hours at the accelerated life test is equivalent to tens of thousands of hours of a not-accelerated usual life test.

As shown in FIG. 1, the sealing cap 3 of the organic EL device 1 is a flat glass plate. It is not, however, limited to this shape. A container-shaped sealing cap 3 may be used in which the sealing part at the outer periphery projects upwardly to form the recessed water-capturing means.

Example 2

In Example 2, the water-capturing medium used in Example 1 was used in combination with calcium oxide (CaO) which is conventional inorganic water-capturing medium. Since the structure of the organic EL device 1 is the same as that of Example 1, Example 2 is described by referring to FIG. 1. Since the glass board 2 and the organic emitting part on the glass board 2 are the same as those of Example 2, descriptions will be omitted.

A flat glass plate for a sealing cap was cleaned and put into a vacuum evaporation apparatus. Then, 3 nm thick film of phthalocyanine blue-CuPc, organic pigment, was vacuum-evaporated on the inner side portion of the sealing cap as the water-capturing layer 7a by the use of an evaporation mask. Thereafter, a vacuum evaporation apparatus was filled with dried nitrogen to release vacuum, and the sealing cap was transferred to a glove box filled with dried nitrogen without being exposed to air. Then, a dispersion type-water-capturing medium was made by dispersing 10 wt % of calcium oxide (CaO), a chemical drying agent, in 48 wt % solution of aluminum oxide octylate ("OLIVE AOO" trade name for HOPE PHARMACEUTICAL CO., LTD.) illustrated by the formula 6. Thereafter, the dispersion type-water-capturing medium thus obtained was added dropwise to the portion on which was vacuum-evaporated a film of phthalocyanine blue-CuPc. Since the phthalocyanine blue-CuPc is an organic pigment and lipophilic, it has good wettability to the solution of aluminum oxide octylate illustrated by the formula 6. While the solution forming the water-capturing layer 7b can spread over the portion on which was vacuum-evaporated CuPc, it can not spread over the plate glass due to the difference in wettability because the plate glass is hydrophobic. Therefore, the water-capturing layer 7b can be formed only the area defined by the water-capturing medium supporting layer 7a.

The sealing cap 3 was put in an atmosphere of dried nitrogen and heated at 150° C. for 20 minutes to volatilize solvent. After drying, the periphery of the sealing cap was coated with ultraviolet-curing epoxy resin adhesive 8 and laminated with a device board, and irradiated with ultraviolet rays to be cured.

At this time, a spacing material having a diameter larger than total thickness of films of the organic pigment and CaO-containing organic water-capturing medium was dispersed inside the epoxy resin adhesive. Thereby, the water-capturing layer does not contact directly with the organic EL layer.

After the state of emission of the organic EL device was observed by a microscope, it was put in an atmosphere at a temperature of 85° C. and humidity of 85% to confirm a water-capturing effect by a accelerated life test. After a lapse of 100 hours the organic EL device was taken out of such an atmosphere, and the state of emission was observed by a microscope. As a result, the growth of non-light emitting part (dark spot) was not observed similarly to example 1. It was, therefore, confirmed that the organic EL device operates sufficiently as a sealing cap.

Example 3

In Example 2, as shown in FIG. 2, the organic emitting layer for white light emission and the water-capturing medium holding layer formed in three colors pattern, that is, red R, green G and blue B were formed, and the sealing cap was functioned as R, G and B filter.

The sealing cap 13 was formed by vacuum-evaporating the water-capturing medium holding layer 17a having colors R, G and B on the same flat glass plate as that of Example 1, and patterning organic pigments of R, G and B in given shape by a mask-evaporation method, respectively. Examples of organic pigment of red R are alizarine red, quinacridone red, naphthol red, monoazo red, polyazo red, perylene red, anthraquinolyle red, diketopyrrolopyrrole red and the like. Examples of organic pigment of green G are phthalocyanine green, sap green and the like. Examples of organic pigment of blue B are phthalocyanine blue etc.

Thereafter, the vacuum evaporation apparatus was filled with dried nitrogen to release vacuum, and the sealing cap 13 was transferred to a glove box filled with dried nitrogen without being exposed to air. Then, a solution-type water-capturing medium was added dropwise to the water-capturing agent holding layer 17a on which was vacuum-evaporated a film of the organic pigment, and the water-capturing medium layer 17b was formed on the surface of the water-capturing medium holding layer. The water-capturing medium layer 17b thus obtained was dry and transparent.

The organic EL light emitting layer was formed by a vacuum evaporation method. Blue and red light emitting materials were used which were complementary to each other in order to allow to emit white light. In order to allow to emit light through the color-filter of the water-capturing protecting layer of the organic pigment and the water-capturing layer, the organic EL device was subjected to a top-emission-type in which the light emission is observed through the sealing cap 13. The cathode electrode 15 of Al thin film was placed on the glass board 12, and Al—Li alloy 5 nm in thickness was vacuum-evaporated as the electron injection layer 14a on the cathode electrode 15. Then, a BCzVBi-doped layer 50 nm in thickness was vacuum-evaporated as a light emitting material on the electron injection layer 14, which was formed by doping DPVBi as a host material with blue phosphor BCzVBi. Thereafter, α-NPD 30 nm in thickness was vacuum-evaporated as the hole transportation layer 14b. The α-NPD was doped with yellow phosphor rubrene. Thereafter, 1-TNATA 70 nm in thickness was vacuum-evaporated as the hole injection layer 14c on the hole transportation layer 14b. Next, IDIXO 150 nm in thickness was placed as the anode 16 to form a light emitting layer. When the organic EL device thus obtained was allowed to emit, yellow light and blue light were obtained to generate white light.

The organic EL board was laminated with the sealing cap equipped with the water-capturing medium layer by means of ultra-violet curing adhesive to obtain an organic EL device.

The organic EL device thus obtained was put in an atmosphere of high temperature of 85° C. and high humidity of 85% to confirm water-capturing effect. Generation and growth of dark spot was observed by a microscope. After a lapse of 100 hours, the growth of non-light emitting part (dark spot) was not observed similarly to example 1. It was, therefore, confirmed that the organic EL device operates sufficiently as a sealing cap.

When a physical drying agent was used for the chemical drying agent, the same effect as that of Example 1 was obtained. Further, when the chemical drying agent was used in combination with a physical drying agent, the same effect as that of Example 1 was obtained.

Comparative Example 1

ITO 150 nm in thickness as an anode, CuPc 20 nm in thickness as a hole injection layer, α-NPD 30 nm in thickness as a hole transportation layer, injection layer, Alq3 50 nm in thickness as an electron transporting light emitting layer, LiF 0.5 nm in thickness as an electron injection layer and aluminum 200 nm in thickness as a cathode were physically-evaporated on a glass substrate in a dry atmosphere, respectively. CaO as a drying member was placed in a recessed part of a sealing cap. Then the sealing cap was placed opposite to the organic EL emitting layer, and sealed together by ultraviolet curing epoxy resin.

An accelerated life test was carried out to an emitting part of the organic EL device thus obtained in an atmosphere at a temperature of 85° C. and humidity of 85% and the growth of dark spot was observed by a microscope. As a result, as shown in FIG. 5, while the diameter of the dark spot was 1 μm at the initial stage, it was grown up to 30 after a lapse of 500 hours. The generation and growth of dark spot were numerous and rapid in the central portion of the organic EL device rather than the peripheral portion thereof.

Comparative Example 2

The same procedures were repeated as those of comparative example 1 except that sealing was performed without water-capturing medium. The state of emission of the organic EL device was observed. Then, the organic EL device was put in an atmosphere of high temperature of 85° C. and high humidity of 85% to confirm water-capturing effect. After a lapse of 500 hours, the device was taken out of such an atmosphere and the state of emission of the organic EL device was observed. As a result, as shown in FIG. 5, the diameter of non-light emitting portion (dark spot) was grown up to 50 nm, the rate of emission area decreased to 60% and emission could not be observed at all after a lapse of 500 hours.

As described above in detail, the present invention has the effects illustrated below by placing a lipophilic water-capturing agent holding layer inside a sealing cap:

(1) Since a water-capturing medium layer for inhibiting the generation and growth of a dark spot in an organic EL device is a thin film, does not contain oxygen and exerts water-capturing effect, the dark spot is not generated and grown, thereby making it possible to provide a long-life and ultra-slim organic EL device.

(2) Since a lipophilic water-capturing medium holding layer can be easily patterned in given or desired shape, the lipophilic water-capturing medium layer is formed in a state of thin film only on the water-capturing medium holding layer and does not spread over a sealing part. Therefore, a long-life and high reliable organic EL device having the sealing part into which water does not penetrate can be provided.

(3) Since the sealing cap of the present invention can be made of the same glass material as that of glass substrate, a high degree of effectiveness can be produced in industry that the selection of adhesive for bonding the sealing part can be easily made, thereby increasing reliability.

(4) It is not necessary to form a recessed portion for water-capturing medium in a plate glass of the sealing cap. Therefore, not only a mold or mask is not required, but also the reduction of waste can be effectively made.

(5) The water-capturing medium layer and the emitting portion can be formed extremely close to each other in a given or desired pattern. Accordingly, the water-capturing effect can be effectively taken, the space inside the package can be decreased and the amount of water incorporated in the package is small. Thereby, it is possible to provide an organic EL device having excellent water-capturing effect.

(6) In the case of a top-emission-type organic EL device the emitting portion of which is observed through a sealing cap, a color organic EL device having a simple structure can be provided by allowing a water-capturing medium layer to function as a color filter.

Obviously, many modifications and variations of the present invention are possible in the light of the above teachings. It is therefore to be understood that within the scope of the appended claims, the invention may be practiced otherwise than as specifically described.

What is claimed is:

1. An organic EL device comprising:
   a sealed container having a glass substrate and a sealing cap bonded to said glass substrate;
   a light emitting region formed on said substrate in said sealed container, said light emitting region being formed of organic EL material layers placed between a pair of opposite anode and cathode electrodes;
   a water-capturing medium holding layer provided on an inner surface of said container spaced apart from said light emitting region; and
   a water-capturing medium layer placed on the surface of said water-capturing medium holding layer,
   wherein said water-capturing holding layer and water-capturing medium layer are comprised of a thin film of lipophilic material.

2. An organic EL device as claimed in claim 1, wherein said sealing cap is composed of a hydrophilic material.

3. An organic EL device as claimed in claim 2, wherein said hydrophilic material is a plate glass.

4. An organic EL device as claimed in claim 1, wherein said water-capturing medium holding layer is composed of lipophilic organic pigment.

5. An organic EL device as claimed in claim 4, wherein said organic pigment is selected from the group consisting of lake pigment, azolake pigment, insoluble azo pigment, condensed azo pigment, azo complex pigment, phthalocyanine pigment, condensed polycyclic pigment and fluorescent pigment.

6. An organic EL device as claimed in claim 1, wherein said water-capturing medium layer is comprised of thin film of organometallic compound represented by the following formula (1):

(1)

wherein R is a group selected from the group consisting of alkyl group, aryl group, cycloalkyl group, heterocyclic group and acyl group having one or more of carbon atoms; M is a trivalent metallic atom and n is an integer of one and above.

7. An organic EL device as claimed in claim 1, wherein said water-capturing medium layer is comprised of an organometallic complex compound represented by the following chemical formula (2):

(2)

wherein $R_1$, $R_2$, $R_3$, $R_4$ and $R_5$ maybe the same or different, and are selected from the group consisting of alkyl group, aryl group, cycloalkyl group, heterocyclic group and acyl group having one or more of carbon atoms; and M is a trivalent metallic atom.

8. An organic EL device as claimed in claim 1, wherein said water-capturing medium layer is comprised of an organometallic complex compound represented by the following formula (3):

(3)

wherein $R_1$, $R_2$, $R_3$ and $R_4$ may be the same or different, and are selected from the group consisting of alkyl group, aryl group, cycloalkyl group, heterocyclic group and acyl group having one or more of carbon atoms; and M is a quadrivalent metallic atom.

9. An organic EL device as claimed in claim 1, wherein said water-capturing medium layer is a film formed by applying water-capturing medium layer forming liquid prepared by dispersing an inorganic drying medium in an organic solvent.

10. An organic EL device comprising:
    a sealed container having a glass substrate and a sealing cap bonded to said glass substrate,
    a light emitting region formed on said substrate in said sealed container, said light emitting region being formed of organic EL material layers placed between a pair of opposite anode and cathode electrodes;
    a water-capturing medium holding layer provided on an inner surface of said container spaced apart from said light emitting region; and
    a water-capturing medium layer placed on the surface of said water-capturing medium holding layer, wherein said water-capturing medium layer is a mixture or combination of an inorganic drying agent with an organic water-capturing medium selected from the group consisting of:

an organometallic compound represented by the following formula (1):

(1)

wherein R is a group selected from the group consisting of alkyl group, aryl group, cycloalkyl group, heterocyclic group and acyl group having one or more of carbon atoms; M is a trivalent metallic atom and n is an integer of one and above;

an organometallic complex compound represented by the following chemical formula (2):

(2)

wherein $R_1$, $R_2$, $R_3$, $R_4$ and $R_5$ may be the same or different, and are selected from the group consisting of alkyl group, aryl group, cycloalkyl group, heterocyclic group and acyl group having one or more of carbon atoms; and M is a trivalent metallic atom; and an organometallic complex compound represented by the following formula (3):

(3)

wherein $R_1$, $R_2$, $R_3$ and $R_4$ may be the same or different, and are selected from the group consisting of alkyl group, aryl group, cyclo alkyl group, heterocyclic group and acyl group having one or more of carbon atoms; and M is a quadrivalent metallic atom.

\* \* \* \* \*